(12) United States Patent
Lin

(10) Patent No.: US 10,998,892 B1
(45) Date of Patent: May 4, 2021

(54) FREQUENCY DOUBLER WITH DUTY CYCLE CONTROL AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 16/992,251

(22) Filed: Aug. 13, 2020

(51) Int. Cl.
*H03K 5/00* (2006.01)
*H03K 5/131* (2014.01)
*H03K 7/08* (2006.01)

(52) U.S. Cl.
CPC ......... *H03K 5/00006* (2013.01); *H03K 5/131* (2013.01); *H03K 7/08* (2013.01); *H03K 2005/00058* (2013.01)

(58) Field of Classification Search
CPC ........ H03B 19/00; H03B 19/10; H03B 19/14; H03B 19/16; H03K 2005/00; H03K 2005/00058; H03K 5/00; H03K 5/00006; H03K 5/131; H03K 7/00; H03K 7/08

USPC .......................................................... 327/122
See application file for complete search history.

(56) References Cited

U.S. PATENT DOCUMENTS

| | | | |
|---|---|---|---|
| 6,348,821 B1 | 2/2002 | Schwartz | |
| 9,973,178 B1* | 5/2018 | Holzmann | H03K 5/134 |
| 2020/0235725 A1* | 7/2020 | Lee | H03K 7/08 |

* cited by examiner

*Primary Examiner* — Lincoln D Donovan
*Assistant Examiner* — David Mattison
(74) *Attorney, Agent, or Firm* — McClure, Qualey & Rodack, LLP

(57) ABSTRACT

A frequency doubler includes a multiplexer, a digitally controlled delay circuit, a divide-by-two circuit, a duty cycle detector, and a controller. The multiplexer receives a first clock and output a second clock in accordance with a third clock, in which the first clock has a fifty percent duty cycle and is a two-phase clock having a first phase and a second phase. The digitally controlled delay circuit receives the second clock and outputs a fourth clock in accordance with a digital word. The divide-by-two circuit receives the fourth clock and outputs the third clock. The duty cycle detector receives the second clock and outputs a logical signal in accordance with a comparison of a duty cycle of the second clock with a target duty cycle value. The controller outputs the digital word in accordance with the logical signal.

20 Claims, 5 Drawing Sheets

US 10,998,892 B1

FREQUENCY DOUBLER WITH DUTY CYCLE CONTROL AND METHOD THEREOF

BACKGROUND OF THE DISCLOSURE

Field of the Disclosure

The present disclosure generally relates to frequency doublers, and, more specifically, to frequency doubler circuits and method having power-efficient duty cycle control.

Description of Related Art

Many modern electronic circuits require a precise clock for proper operation. A clock is a voltage signal that periodically toggles back and forth between a low level and a high level. A percentage of time that the voltage signal stays in the high level is called a duty cycle. Many circuits require a specific duty cycle for a clock to provide an optimal performance. For instance, in a multi-phase clock system in which both a rising edge and a falling edge of a clock are used, a 50% duty cycle is usually desired.

A conventional frequency doubler circuit (also referred to herein as simply frequency doubler) receives an input clock and outputs an output clock so that a frequency of the output clock is twice of a frequency of the input clock. A duty cycle of the output clock, however, may not be desirable. In the U.S. Pat. No. 6,348,821, a frequency doubler with 50% duty cycle output was disclosed by Schwartz. The frequency doubler has an analog circuit nature that requires periodically charging a capacitor using a current generator and is thus not very power efficient. Besides, the frequency doubler is for generating a 50% duty cycle output, which is good for many applications but may not be good for all applications.

What is desired is a frequency doubler with a duty cycle control that has a digital circuit nature and more power efficient and is not limited to generating a 50% duty cycle output.

BRIEF DESCRIPTION OF THIS DISCLOSURE

In an embodiment, a frequency doubler circuit is provided. The frequency doubler circuit includes a multiplexer, a digitally controlled delay circuit, a divide-by-two circuit, a duty cycle detector, and a controller. The multiplexer receives a first clock and outputs a second clock in accordance with a third clock, in which the first clock has a fifty percent duty cycle and is a two-phase clock including a first phase and a second phase. The digitally controlled delay circuit receives the second clock and outputs a fourth clock in accordance with a digital word. The divide-by-two circuit receives the fourth clock and outputs the third clock. The duty cycle detector receives the second clock and outputs a logical signal in accordance with a comparison of a duty cycle of the second clock with a target duty cycle value. The controller outputs the digital word in accordance with the logical signal.

In an embodiment, a method of frequency doubling is provided. The method includes the following steps: receiving a first clock that has a fifty percent duty cycle and is a two-phase clock including a first phase and a second phase; outputting a second clock using a multiplexer by selecting one of the first phase and the second phase of the first clock in accordance with a third clock; delaying the second clock into a fourth clock using a digital controlled delay circuit in accordance with a digital word; using a divide-by-two circuit to output the third clock in accordance with the fourth clock; generating a logical signal in accordance with a comparison of a duty cycle of the second clock with a target duty cycle value using a duty cycle detector; and updating the digital word in accordance with the logical signal.

DETAILED DESCRIPTION OF THIS DISCLOSURE

Figure 1A:
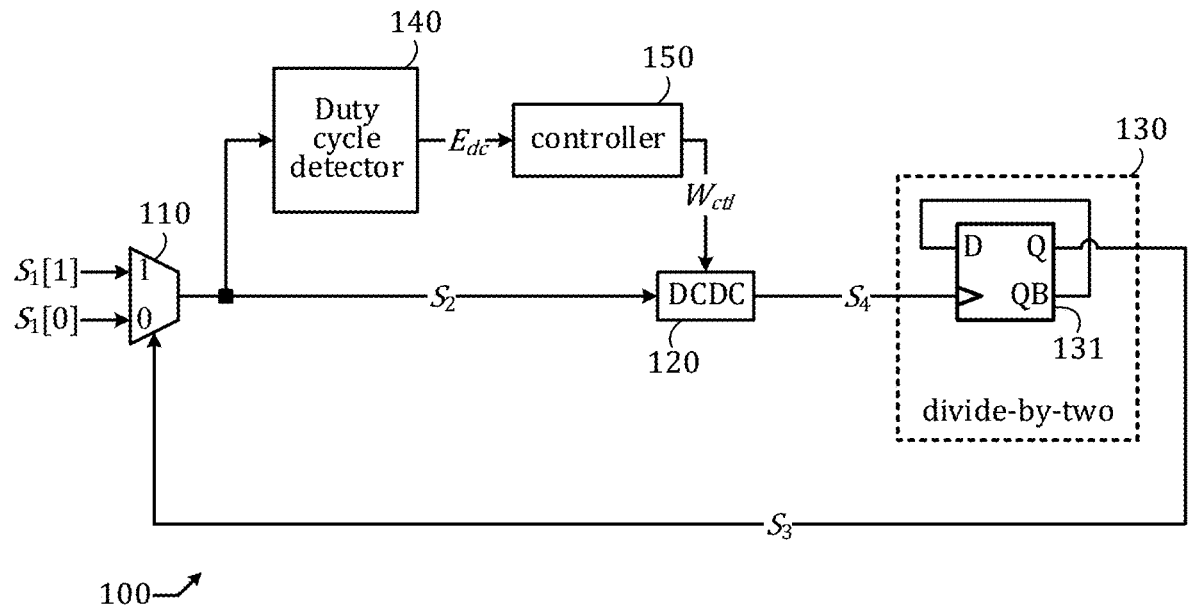
FIG. 1A shows a schematic diagram of frequency doubler in accordance with an embodiment of the present disclosure.

The present disclosure is directed to frequency doublers and associated methods. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "signal," "power supply," "ground," "CMOS (complementary metal oxide semiconductor)," "NMOS (n-channel metal oxide semiconductor)," "PMOS (p-channel metal oxide semiconductor)," "resistor," "capacitor," "comparator," "inverter," "logical signal," "multiplexer," "switch," "data flip flop," "low-pass filter," and "duty cycle." Terms like these are used in a context of microelectronics, and the associated concepts are apparent to those of ordinary skills in the art and thus will not be explained in detail here.

Those of ordinary skill in the art will recognize a resistor symbol and can recognize a MOS (metal-oxide semiconductor) transistor symbol, for both PMOS transistor and NMOS transistor, and identify the "source," the "gate," and the "drain" terminals thereof. Those of ordinary skills in the art can read schematics of a circuit comprising resistors, NMOS transistors, and PMOS transistors, and do not need a verbose description about how one transistor or resistor connects with another in the schematics.

This present disclosure is disclosed in terms of an engineering sense. For instance, regarding two variables X and Y, when it is said that "X is equal to Y," this means that "X is approximately equal to Y," i.e., "a difference between X and Y is smaller than a specified engineering tolerance." When it is said that "X is zero," this means that "X is approximately zero," i.e., "X is smaller than a specified engineering tolerance." When it is said that "X is substantially smaller than Y," this means that "X is negligible with respect to Y," i.e., "a ratio between X and Y is smaller than an engineering tolerance and therefore X is negligible when compared to Y."

Throughout this disclosure, "$V_{DD}$" denotes a power supply node. It should be noted that a power supply node is a node at which a voltage level is substantially stationary. In this disclosure, depending on a context that is apparent to those of ordinary skill in the art, sometimes $V_{DD}$ refers to the voltage level at the power supply node $V_{DD}$. For instance, it is apparent that when it is said that "$V_{DD}$ is 1.05V", this means that the voltage level at the power supply node $V_{DD}$ is 1.05V. A ground node is a node at which a voltage level is substantially zero.

In this present disclosure, a signal is a voltage of a variable level that can vary with time, or a number with a value that can vary with time. When a signal is a voltage, it is called a voltage signal and a level of the signal at a moment represents a state of the signal at that moment. When a signal is a number, it is called a numerical signal, and a value of the signal at a moment represents a state of the signal at that moment.

A logical signal is a voltage signal of two states: a low state and a high state. The low state is also referred to as a "0" state, while the high stage is also referred to as a "1" state. Regarding a logical signal Q, when it is stated that "Q is high" or "Q is low," this means that is "Q is in the high state" or "Q is in the low state." Likewise, when it is stated that "Q is 1" or "Q is 0," this means that "Q is in the 1 state" or "Q is in the 0 state."

When a logical signal toggles from low to high, it undergoes a low-to-high transition and exhibits a rising edge. When a logical signal toggles from high to low, it undergoes a high-to-low transition and exhibits a falling edge.

When a MOS transistor is used to embody a switch, it is controlled by a control signal that is a logical signal applied at a gate of the MOS transistor. A switch embodied by a NMOS transistor is in an "on" state when the control signal is high, and in an "off" state when the control signal is low.

A first logical signal is said to be a logical inversion of a second logical signal, if the first logical signal and the second logical signal are always in opposite states. That is, when the first logical signal is low, the second logical signal is high; when the first logical signal is high, the second logical signal is low. When a first logical signal is said to be a logical inversion of a second logical signal, the first logical signal and the second logical signal are said to be complementary to each other.

A two-phase clock is a clock that has two phases including a first phase and a second phase, wherein the second phase is a logical inversion of the first phase and thus complementary to the first phase; when both the first phase and the second phase have a fifty percent duty cycle, the two-phase clock is said to have a fifty percent duty cycle.

A digital word is a numerical signal of an integer value that can be embodied by a collection of a plurality of logical signals in accordance with a certain encoding scheme.

A circuit is a collection of a transistor, a resistor, and/or other electronic devices inter-connected in a certain manner to embody a certain function.

A schematic diagram of a frequency doubler 100 in accordance with an embodiment of the present disclosure is shown in FIG. 1A. The frequency doubler 100 comprises a multiplexer 110, a digitally controlled delay circuit (DCDC) 120, a divide-by-two circuit 130, a duty cycle detector 140, and a controller 150. The multiplexer 110 is configured to receive a first clock $S_1$, which has a 50% duty cycle and is a two-phase clock comprising a first phase $S_1[0]$ and a second phase $S_1[1]$, and to output a second clock $S_2$ in accordance with a third clock $S_3$. The digitally controlled delay circuit (DCDC) 120 is configured to receive the second clock $S_2$ and to output a fourth clock $S_4$ in accordance with a digital word $W_{ctl}$. The divide-by-two circuit 130 is configured to receive the fourth clock $S_4$ and to output the third clock $S_3$. The duty cycle detector 140 is configured to receive the second clock $S_2$ and to output a logical signal $E_{dc}$. The controller 150 is configured to receive the logical signal $E_{dc}$ and to output the digital word $W_{ctl}$. For brevity, hereafter: the first clock $S_1$ is simply referred to as $S_1$; the first phase $S_1[0]$ of the first clock $S_1$ is simply referred to as $S_1[0]$; the second phase $S_1[1]$ of the first clock $S_1$ is simply referred to as $S_1[1]$; the second clock $S_2$ is simply referred to as $S_2$; the third clock $S_3$ is simply referred to as $S_3$; the fourth clock $S_4$ is simply referred to as $S_4$; the logical signal $E_{dc}$ is simply referred to as $E_{dc}$; and the digital word $W_{ctl}$ is simply referred to as $W_{ctl}$.

Multiplexer 110 outputs $S_2$ by selecting either $S_1[0]$ or $S_1[1]$ to be $S_2$ in accordance with $S_3$, and its function can be described as follows:

$$S_2 = \begin{cases} S_1[0] & \text{if } S_3 \text{ is } 0 \\ S_1[1] & \text{if } S_3 \text{ is } 1 \end{cases} \quad (1)$$

A multiplexer, such as one that can embody multiplexer 110 of FIG. 1A in accordance with equation (1), is well known in the prior art and thus not described in detail herein.

DCDC 120 embodies a programmable delay function such that $S_4$ is a delay of $S_2$, wherein a rising edge of $S_2$ propagates through and eventually becomes a rising edge of $S_4$ with a propagation delay controlled by $W_{ctl}$. Divide-by-two circuit 130 embodies a divide-by-two function such that a rising edge of $S_4$ triggers $S_3$ to toggle state, resulting in either a rising edge or a falling edge of $S_3$. If one assigns a sequential number for each rising edge of $S_4$, an even-numbered rising edge of $S_4$ triggers a toggling of $S_3$ from low to high, i.e., a rising edge of $S_3$, while an odd-numbered rising edge of $S_4$ triggers a toggling of $S_3$ from high to low, i.e., a falling edge of $S_3$. Every two rising edges of $S_4$ trigger only one rising edge of $S_3$; therefore $S_3$ is said to be a divide-by-two clock of $S_4$.

$S_1$ is a two-phase clock that has a 50% duty cycle. Let a period of $S_1$ be T. A purpose of the frequency doubler 100 is to make $S_2$ a clock of a double frequency and having a target duty cycle value. That is, a period of $S_2$ is equal to T/2, since a frequency doubling means a period halving. $S_4$ is a delay of $S_2$ and therefore also has the same period T/2. $S_3$ is a divide-by-two clock of $S_4$, and therefore a period of $S_3$ is twice of the period of $S_4$, and thus is equal to T.

Figure 1B:
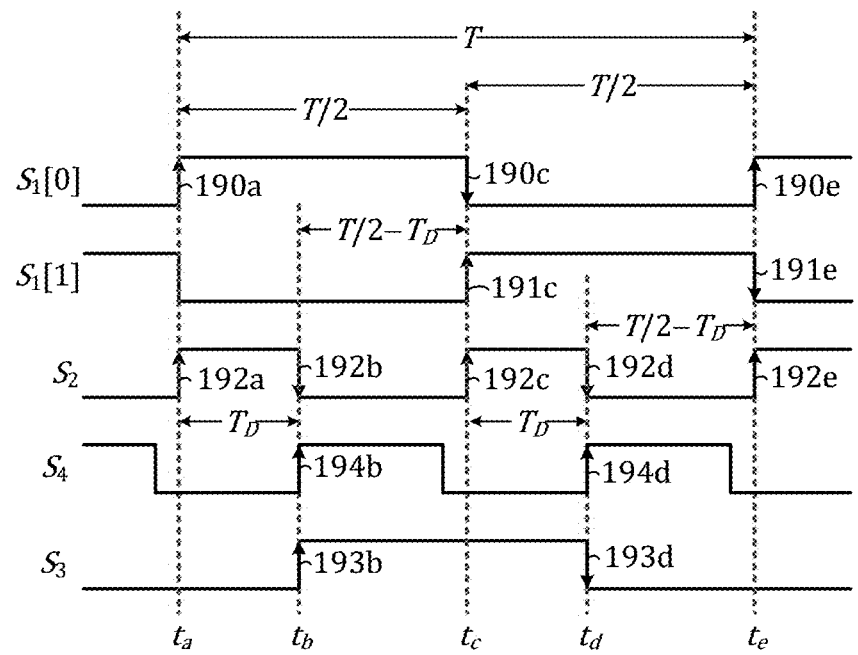
FIG. 1B shows a timing diagram of the frequency doubler of FIG. 1A.

DCDC 120 receives $S_2$ and outputs $S_4$, so that a rising edge of $S_2$ can propagate and become a rising edge of $S_4$ with a propagation delay. Let the propagation delay of DCDC 120 be $T_D$. A timing diagram of frequency doubler 100 is shown in FIG. 1B. Here, $S_1[0]$, $S_1[1]$, $S_2$, $S_4$, and $S_3$ are all clocks that are logical signals that are either high (at $V_{DD}$) or low (at 0V). As shown, $S_1[0]$ and $S_1[1]$ are complementary. A period of $S_1[0]$ is T, as demonstrated by a time difference of T between a rising edge 190a (at time $t_a$), and a next rising edge 190e (at time $t_e$). A duty cycle of $S_1[0]$ is 50%, as demonstrated by a time difference of T/2 between the rising edge 190a and a next falling edge 190c (at time $t_c$), showing that $S_1[0]$ stays high for 50% of the time of a clock cycle. It is obvious to those of ordinary skill in the art without a need of explanation that a period of $S_1[1]$ is T and a duty cycle of $S_1[1]$ is 50%. Initially, $S_3$ is low (i.e., 0), so multiplexer 110 selects $S_1[0]$ as $S_2$. At time $t_a$, rising edge 190a of $S_1[0]$ leads to rising edge 192a of $S_2$, which propagates through DCDC 120 and results in rising edge 194b of $S_4$ at time $t_b$, wherein a time difference between time $t_b$ and time $t_a$ is $T_D$, which is the propagation delay of DCDC 120. Rising edge 194b of $S_4$ triggers $S_3$ to toggle to high (i.e., 1) and results in rising edge 193b of $S_3$ at time $t_b$ that prompts multiplexer 110 to select $S_1[1]$ as $S_2$ and leads to falling edge 192b of $S_2$ at time $t_b$. Later, at time $t_c$, wherein a time difference between time t, and time $t_b$ is $T/2-T_D$, rising edge 191c of $S_1[1]$ leads to rising edge 192c of $S_2$, since multiplexer 110 selects $S_1[1]$ as $S_2$. Rising edge 192c of $S_2$ propagates through DCDC 120, results in rising edge 194d of $S_4$ at time $t_d$ that triggers $S_3$ to toggle to low (i.e., 0), and results in a falling edge 193d of $S_3$ at time $t_d$ that prompts multiplexer 110 to select $S_1[0]$ as $S_2$ and leads to falling edge 192d of $S_2$ at time $t_d$, wherein a time difference between time $t_d$ and time $t_c$ is $T_D$, which is the propagation delay of DCDC 120. Later, at time $t_e$, wherein a time difference between time $t_e$ and time $t_d$ is $T/2-T_D$, rising edge 190e of $S_1[0]$ leads to rising edge 192e of $S_2$, since multiplexer 110 selects $S_1[0]$ as $S_2$. A duty cycle of $S_2$ is equal $T_D$ divided by T/2 and can be expressed by the following equation:

$$D_o = \frac{2T_D}{T} \quad (2)$$

Here, $D_o$ denotes a duty cycle of $S_2$.

A purpose of duty cycle detector 140 and controller 150 is to establish a proper value for $W_{ctl}$ such that $D_o$ is equal to a target duty cycle value D.

Duty cycle detector 140 outputs $E_{dc}$ in accordance with the following equation:

$$E_{dc} = \begin{cases} 1 & \text{if } D_O > D_t \\ 0 & \text{otherwise} \end{cases} \quad (3)$$

When $E_{dc}$ is 1, this indicates the duty cycle of $S_2$ is larger than the target duty cycle value $D_t$ and thus needs to be decreased. When $E_{dc}$ is 0, this indicates the duty cycle of $S_2$ is smaller than the target duty cycle value $D_t$ and thus needs to be increased.

In an embodiment, $W_{ctl}$ is an integer, and a greater value of $W_{ctl}$ leads to a greater value of the propagation delay $T_D$ of DCDC 120. In an embodiment, the controller 150 periodically updates a value of $W_{ctl}$ in accordance with $E_{dc}$.

$$W_{ctl}^{(new)} = \begin{cases} W_{ctl}^{(old)} - 1 & \text{if } E_{dc} = 1 \\ W_{ctl}^{(old)} + 1 & \text{if } E_{dc} = 0 \end{cases} \quad (4)$$

Here $W_{ctl}^{(old)}$ denotes an old value of $W_{ctl}$ before an update, while $W_{ctl}^{(new)}$ denotes a new value of $W_{ctl}$ after the update. When the duty cycle of $S_2$ is too large (i.e., $D_0 > D_t$), $E_{dc}$ is 1, the controller 150 decrements the value of $W_{ctl}$, leading to a smaller propagation delay of DCDC 120 and thus decreasing the duty cycle of $S_2$; when the duty cycle of $S_2$ is too small (i.e., $D_o < D_t$), $E_{dc}$ is 0, the controller 150 increments the value of $W_{ctl}$, leading to a larger propagation delay of DCDC 120 and thus increasing the duty cycle of $S_2$.

Figure 2A:
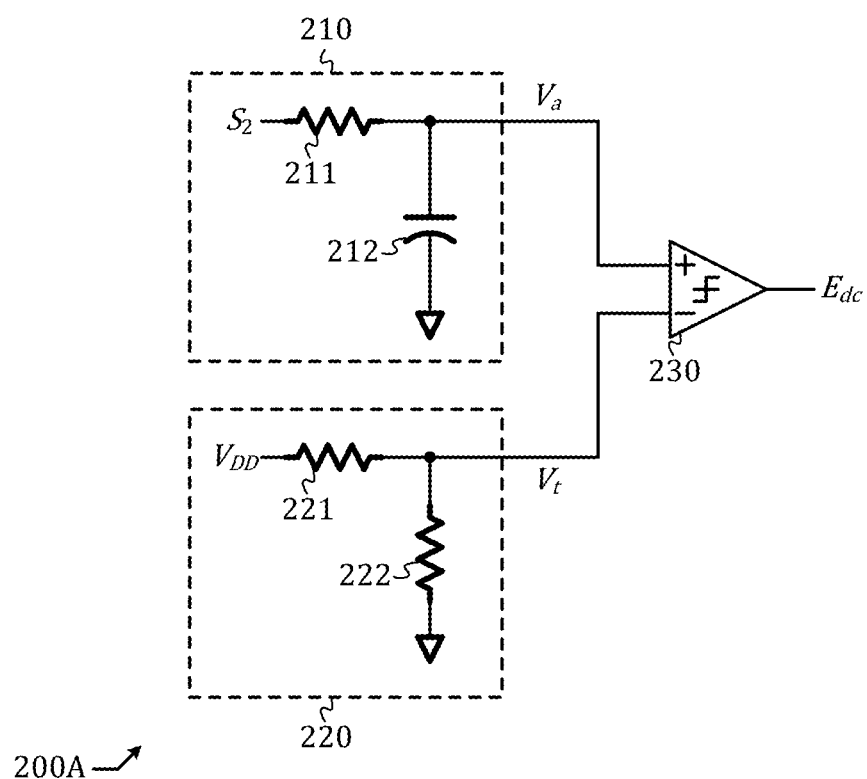
FIG. 2A shows a schematic diagram of a duty cycle detector.

A schematic diagram of a duty cycle detection circuit 200A that can be used to embody duty cycle detector 140 is shown in FIG. 2A. Duty cycle detection circuit 200A comprises a low-pass filter 210 comprising resistor 211 and capacitor 212, a resistive voltage divider 220 comprising resistor 221 and resistor 222, and a comparator 230. Low-pass filter 210 receives $S_2$ and output an average voltage $V_a$ that is approximately $D_o V_{DD}$. For instance, if the duty cycle of $S_2$ is 40%, $V_a$ will be approximately $0.4 \cdot V_{DD}$, since $S_2$ stays high at $V_{DD}$ for 40% of the time. Resistive voltage divider 220 outputs a target voltage $V_t$ that presents $D_t$, the target duty cycle value for $S_2$. Let resistances of resistor 221 and resistor 222 be $R_{221}$ and $R_{222}$, respectively. $R_{221}$ is chosen in accordance with $$R_{221} = R_{222} \cdot \left(\frac{1}{D_t} - 1\right) \quad (5)$$

The target voltage $V_t$ is established in accordance with a voltage division of $V_{DD}$ across resistors 221 and 222, i.e.

$$V_t = \frac{R_{222}}{R_{221} + R_{222}} \cdot V_{DD} = D_t V_{DD} \quad (6)$$

Here, equation (5) is applied. Comparator 230 compares $V_a$ with $V_t$ and outputs $E_{dc}$, indicating whether $V_a$ is higher than $V_t$. When $V_a$ is higher (lower) than $V_t$, $E_{dc}$ is 1 (0), and this indicates $D_o V_{DD}$ is larger (smaller) than $D_t V_{DD}$, thus $D_o$ is larger (smaller) than $D_t$. When $D_o$ is larger (smaller) than $D_t$, $E_{dc}$ is 1 (0), controller 150 decrements (increments) the value of $W_{ctl}$, resulting in a decrement (increment) of the propagation delay $T_D$ and the duty cycle of $S_2$. The duty cycle of $S_2$ is thus adjusted in a closed loop manner towards being equal to $D_t$.

Figure 2B:
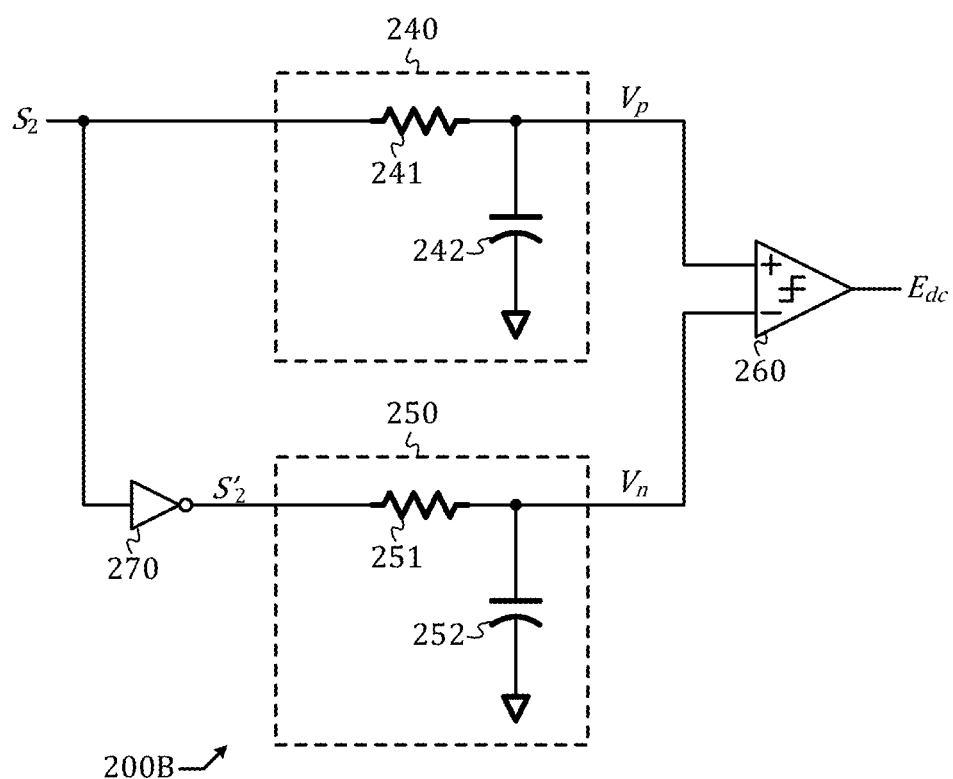
FIG. 2B shows a schematic diagram of an alternative duty cycle detector.

In a special case where the target duty cycle value $D_t$ is 50%, an alternative duty cycle detector 200B shown in FIG. 2B can be used to embody duty cycle detector 140 of FIG. 1A. Duty cycle detector 200B comprises: a first low-pass filter 240 comprising resistor 241 and capacitor 242, an inverter 270, a second low-pass filter 250 comprising resistor 251 and capacitor 252, and a comparator 260. Inverter 270 receives $S_2$ and outputs a complementary signal $S'_2$, which is a logical inversion of $S_2$. Since the duty cycle of $S_2$ is $D_o$, the duty cycle of $S'_2$ is $1-D_o$, because $S'_2$ is complementary to $S_2$. The first low-pass filter 240 receives $S_2$ and output a first average voltage $V_p$ that is approximately $D_o V_{DD}$. For instance, if the duty cycle of $S_2$ is 40%, $V_p$ will be approximately $0.4 \cdot V_{DD}$, since $S_2$ stays high at $V_{DD}$ for 40% of the time. The second low-pass filter 250 receives $S'_2$ and output a second average voltage $V_n$ that is approximately $(1-D_o)V_{DD}$. For instance, if the duty cycle of $S_2$ is 40%, $V_n$ will be approximately $0.6 \cdot V_{DD}$, since $S'_2$ stays high at $V_{DD}$ for 60% of the time due to being complementary to $S_2$. Comparator 260 compares $V_p$ with $V_n$ and outputs $E_{dc}$, indicating whether $V_p$ is higher than $V_n$. When $V_p$ is higher/lower than $V_n$, $E_{dc}$ is 1 (0), this indicates that $D_o V_{DD}$ is larger/smaller than $(1-D_o)V_{DD}$, thus $D_o$ is larger/smaller than $(1-D_o)$, and that indicates that $D_o$ is larger/smaller than 50%. Therefore, duty cycle detector 200B can perform a duty cycle detection for $S_2$ if the target duty cycle value $D_t$ is 50%.

A comparator, such as comparator 230 in FIG. 2A or comparator 260 in FIG. 2B, is a circuit that receives two voltages and outputs a logical signal that indicates which one of the two voltages is higher, and can be implemented using whatever circuit known in the prior art at a discretion of a circuit designer. An inverter such as inverter 270 performs a logical inversion and is well known in the prior art and thus not described in detail here.

Figure 3:
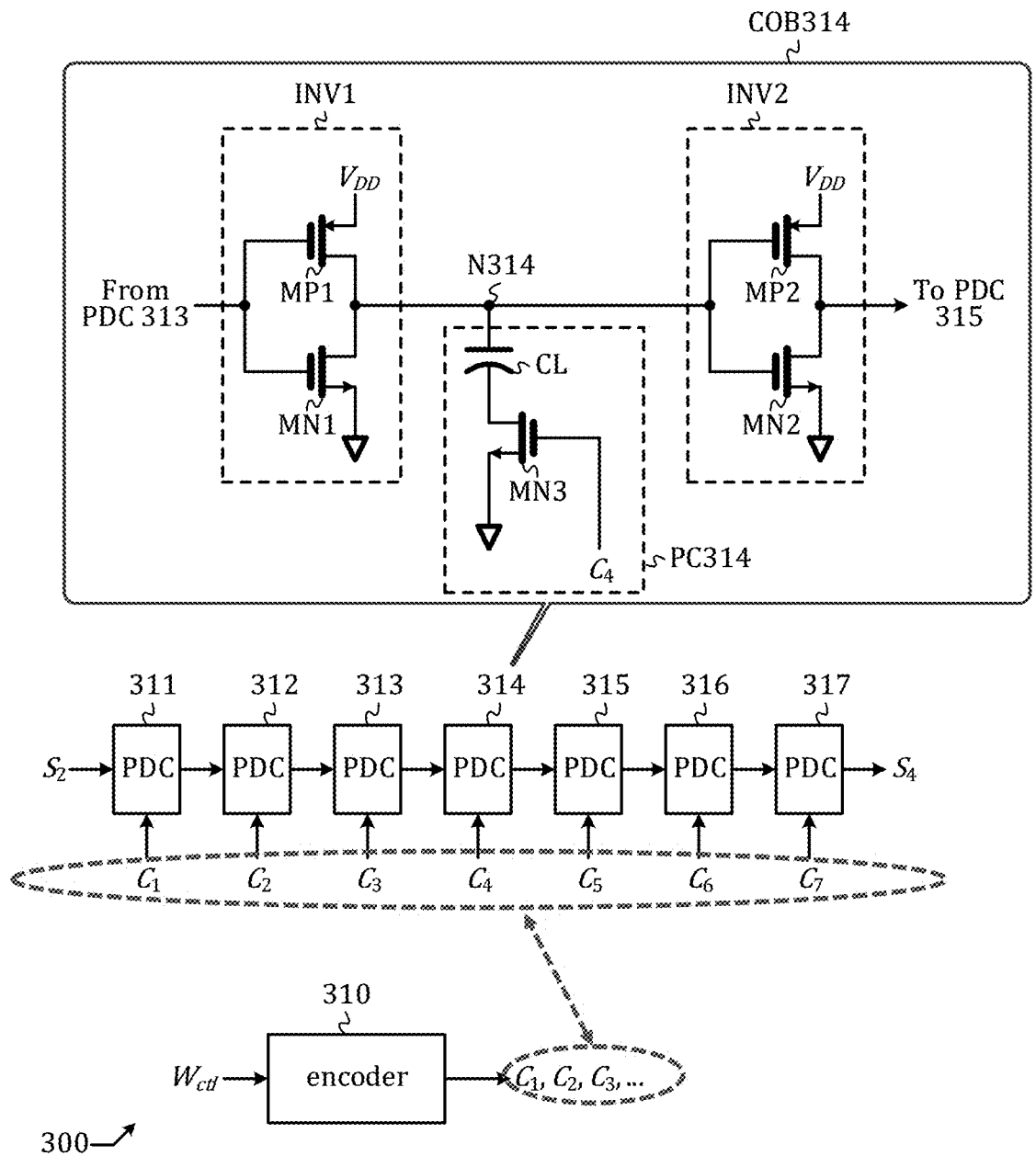
FIG. 3 shows a schematic diagram of a digitally controlled delay circuit.

A schematic diagram of a digitally controlled delay circuit 300 that can be used to embody DCDC 120 of FIG. 1A is depicted in FIG. 3. Digitally controlled delay circuit 300 comprises: an encoder 310 configured to encode $W_{ctl}$ into a plurality of logical control signals $C_1, C_2, C_3$, and so on; and a plurality of programmable delay circuits (PDC) 311, 312, 313, and so on, controlled by said plurality of logical signals $C_1, C_2, C_3$, and so on, respectively, and cascaded to form a delay chain configured to receive $S_2$ and output $S_4$, wherein a rising edge of $S_2$ will propagate along the delay chain and at the end of the delay chain become a rising edge of $S_4$. By way of example but not limitation, what are shown in FIG. 3 are seven logical control signals $C_1, C_2, C_3, C_4, C_5, C_6$, and $C_7$, and seven programmable delay circuits (PDC) 311, 312, 313, 314, 315, 316, and 317 that are cascaded and controlled by $C_1, C_2, C_3, C_4, C_5, C_6$, and $C_7$, respectively. In an embodiment, PDC 311, 312, 313, and so on, are all identical circuits but controlled independently and respectively by $C_1, C_2, C_3$, and so on. Each PDC introduces a delay determined by its respective logical control signal; PDC 311 (312, 313, 314, 315, 316, 317) introduces a delay controlled by $C_1$ ($C_2, C_3, C_4, C_5, C_6, C_7$); when $C_1$ ($C_2, C_3, C_4, C_5, C_6, C_7$) is 0, PDC 311 (312, 313, 314, 315, 316, 317) has a small delay $\Delta_0$; and when $C_1$ ($C_2, C_3, C_4, C_5, C_6, C_7$) is 1, PDC 311 (312, 313, 314, 315, 316, 317) has a large delay $\Delta_1$, where $\Delta_1$ is larger than $\Delta_0$. Here, "large delay" and "small delay" are stated in a relative sense. The propagation delay of DCDC 120 when embodied by digitally controlled delay circuit 300 is thus:

$$T_D = \sum_{i=1,2,3,\ldots} (C_i \Delta_1 + (1-C_i)\Delta_0) \quad (7)$$

In an embodiment, encoder 310 encodes $W_1$ into $C_1, C_2, C_3$, and so on in accordance with a "thermometer code" encoding scheme that can be described by the following equation:

$$C_i = \begin{cases} 0 & \text{if } W_{ctl} < i \\ 1 & \text{if } W_{ctl} \geq i \end{cases} \quad (8)$$

Here, i=1, 2, 3, and so on, denoting an index. For the example of seven programmable delay circuits, a table of the encoding is shown below:

| $W_{ctl}$ | 0 | 1 | 2 | 3 | 4 | 5 | 6 | 7 |
|---|---|---|---|---|---|---|---|---|
| $C_1$ | 0 | 1 | 1 | 1 | 1 | 1 | 1 | 1 |
| $C_2$ | 0 | 0 | 1 | 1 | 1 | 1 | 1 | 1 |
| $C_3$ | 0 | 0 | 0 | 1 | 1 | 1 | 1 | 1 |
| $C_4$ | 0 | 0 | 0 | 0 | 1 | 1 | 1 | 1 |
| $C_5$ | 0 | 0 | 0 | 0 | 0 | 1 | 1 | 1 |
| $C_6$ | 0 | 0 | 0 | 0 | 0 | 0 | 1 | 1 |
| $C_7$ | 0 | 0 | 0 | 0 | 0 | 0 | 0 | 1 |

As a value of $W_1$ increases, more of logical control signals $C_1, C_2, C_3$, and so on, are set to 1, leading to more of PDC 311, 312, 313, and so on, being controlled to have a large delay, and as a result the propagation delay of the digitally controlled delay circuit 300 increases.

A schematic diagram of an embodiment of PDC 314 is shown inside of call-out box COB314. PDC 314 receives input from PDC 313 and outputs output to PDC 315 in accordance with logical control signal $C_4$. PDC 314 comprises a cascade of a first inverter INV1 (comprising a first NMOS transistor MN1 and a first PMOS transistor MP1) and a second inverter INV2 (comprising a second NMOS transistor MN2 and a second PMOS transistor MP2), and an tunable capacitor PC314 (comprising a capacitor CL, and a switch embodied by a third NMOS transistor MN3 controlled by logical control signal $C_4$). The tunable capacitor PC314 embodies a tunable capacitive load at an internal node N314 between the first inverter INV1 and the second inverter INV2; a higher capacitive load at the internal node N314 leads to a larger delay for the signal to propagate from PDC 313 to PDC 315. When $C_4$ is 1, the third NMOS transistor MN3 is turned on, a capacitance of the tunable PC314 is approximately equal to a capacitance of the capacitor CL; when $C_4$ is 0, the third NMOS transistor MN3 is turned off, a capacitance of the tunable PC314 is approximately zero. This way, PDC 314 can have a small delay when $C_4$ is 0, and a large delay when $C_4$ is 1.

The same circuit inside of call-out box COB314 is used for all other programmable delay cells, only that the input, the output, and the logical control signal are different.

The divide-by-two circuit 130 comprises a DFF (data flip flop) 131 that has a data pin "D," an output pin "Q," a complementary output pin "QB," and an edge trigger pin denoted by a wedge symbol. DFF 131 is triggered by a rising edge of $S_4$ and outputs $S_3$ via its output pin "Q," while a negative feedback is formed by connecting the complementary output pin "QB" to the data pin "D." Data flip flop 131 and that it can be used to embody a divide-by-two function when configured in a negative feedback topology as shown in FIG. 1A are well known in the prior art and thus not described in detail here.

Figure 4:
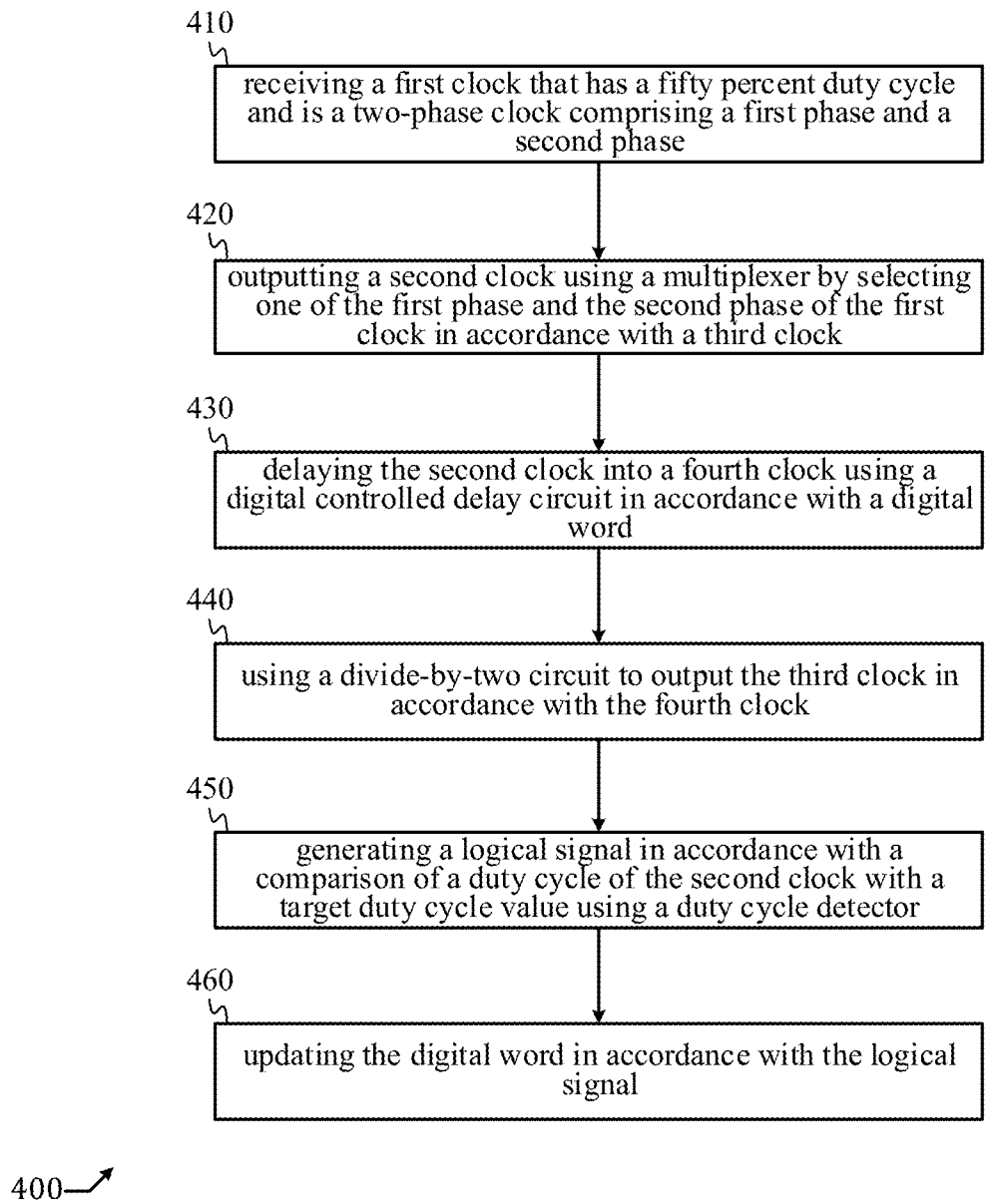
FIG. 4 shows a flow diagram of a method of frequency doubling in accordance with an embodiment of the present disclosure.

As illustrated by a flow diagram shown in FIG. 4, a method of frequency doubling in accordance with an embodiment of the present disclosure comprises: (step 410) receiving a first clock that has a fifty percent duty cycle and is a two-phase clock comprising a first phase and a second phase; (step 420) outputting a second clock using a multiplexer by selecting one of the first phase and the second phase of the first clock in accordance with a third clock; (step 430) delaying the second clock into a fourth clock using a digital controlled delay circuit in accordance with a digital word; (step 440) using a divide-by-two circuit to output the third clock in accordance with the fourth clock; (step 450) generating a logical signal in accordance with a comparison of a duty cycle of the second clock with a target duty cycle value using a duty cycle detector; and (step 460) updating the digital word in accordance with the logical signal.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. A frequency doubler circuit comprising: a multiplexer configured to receive a first clock and output a second clock in accordance with a third clock, wherein the first clock has a fifty percent duty cycle and is a two-phase clock comprising a first phase and a second phase; a digitally controlled delay circuit configured to receive the second clock and output a fourth clock in accordance with a digital word; a divide-by-two circuit configured to receive the fourth clock and output the third clock; a duty cycle detector configured to receive the second clock and output a logical signal in accordance with a comparison of a duty cycle of the second clock with a target duty cycle value; and a controller configured to output the digital word in accordance with the logical signal.

2. The frequency doubler circuit of claim 1, wherein: a greater value of the digital word leads to a greater propagation delay of the digital controlled delay circuit.

3. The frequency doubler circuit of claim 2, wherein the controller increments a value of the digital word when the logical signal indicates the duty cycle of the second clock is smaller than the target duty cycle value, and decrements the value of the digital word when the logical signal indicates the duty cycle of the second clock is larger than the target duty cycle value.

4. The frequency doubler circuit of claim 3, wherein the digitally controlled delay circuit comprises an encoder configured to encode the digital word into a plurality of logical control signals and a plurality of programmable delay circuits that are controlled by said plurality of logical control signals, respectively, cascaded, and configured to form a delay chain to allow the second clock to propagate and result in the fourth clock.

5. The frequency doubler circuit of claim 4, wherein the encoder is based on a thermometer code encoding scheme.

6. The frequency doubler circuit of claim 5, wherein each of said plurality of programmable delay circuits has a large delay when its respective logical control signal is high, and a small delay when its respective logical control signal is low.

7. The frequency doubler circuit of claim 1, wherein the duty cycle detector comprises a low-pass filter configured to receive the second clock and output an average voltage, a voltage divider configured to receive a power supply voltage and output a target voltage, and a comparator configured to output the logical signal in accordance of with a comparison of the average voltage with the target voltage.

8. The frequency doubler circuit of claim 7, wherein the target voltage is equal to the power supply voltage multiplied by the target duty cycle value.

9. The frequency doubler circuit of claim 1, wherein the duty cycle detector comprises a first low-pass filter configured to receive the second clock and output a first average voltage, an inverter configured to receive the second clock and output a complementary clock, a second low-pass filter configured to receive the complementary clock and output a second average voltage, and a comparator configured to output the logical signal in accordance of with a comparison of the first average voltage with the second average voltage.

10. The frequency doubler circuit of claim 1, wherein the divide-by-two circuit comprises a data flip flop configured in a negative feedback topology.

11. A method of frequency doubling comprising: receiving a first clock that has a fifty percent duty cycle and is a two-phase clock comprising a first phase and a second phase; outputting a second clock using a multiplexer by selecting one of the first phase and the second phase of the first clock in accordance with a third clock; delaying the second clock into a fourth clock using a digital controlled delay circuit in accordance with a digital word; using a divide-by-two circuit to output the third clock in accordance with the fourth clock: generating a logical signal in accordance, with a comparison of a duty cycle of the second clock with a target duty cycle value using a duty cycle detector; and updating the digital word in accordance with the logical signal.

12. The method of frequency doubling of claim 11, wherein: a greater value of the digital word leads to a greater propagation delay of the digital controlled delay circuit.

13. The method of frequency doubling of claim 12, wherein updating the digital word in accordance with the logical signal comprises incrementing a value of the digital word when the logical signal indicates the duty cycle of the second clock is smaller than the target duty cycle value, and decrementing the value of the digital word when the logical signal indicates the duty cycle of the second clock is larger than the target duty cycle value.

14. The method of frequency doubling of claim 13, wherein the digitally controlled delay circuit comprises an encoder configured to encode the digital word into a plurality of logical control signals and a plurality of programmable delay circuits that are controlled by said plurality of logical control signals, respectively, cascaded, and configured to form a delay chain to allow the second clock to propagate and result in the fourth clock.

15. The method of frequency doubling of claim 14, wherein the encoder is based on a thermometer code encoding scheme.

16. The method of frequency doubling of claim 15, wherein each of said plurality of programmable delay circuits has a large delay when its respective logical control signal is high, and a small delay when its respective logical control signal is low.

17. The method of frequency doubling of claim 11, wherein the duty cycle detector comprises a low-pass filter configured to receive the second clock and output an average voltage, a voltage divide configured to receive a power supply voltage and output a target voltage, and a comparator configured to output the logical signal in accordance of with a comparison of the average voltage with the target voltage.

18. The method of frequency doubling of claim 17, wherein the target voltage is equal to the power supply voltage multiplied by the target duty cycle value.

19. The method of frequency doubling of claim 11, wherein the duty cycle detector comprises a first low-pass filter configured to receive the second clock and output a first average voltage, an inverter configured to receive the second clock and output a complementary clock, a second low-pass filter configured to receive the complementary clock and output a second average voltage, and a comparator configured to output the logical signal in accordance of with a comparison of the first average voltage with the second average voltage.

20. The method of frequency doubling of claim 11, wherein the divide-by-two circuit comprises a data flip-flop configured in a negative feedback topology.

* * * * *